United States Patent [19]

Morisson

[11] Patent Number: 6,091,352
[45] Date of Patent: Jul. 18, 2000

[54] A/D CONVERSION DEVICE HAVING SYNCHRONOUS OUTPUT SIGNALS

[75] Inventor: Richard Morisson, Saint-Aubin/Mer, France

[73] Assignee: U.S. Philips Corporation, New York, N.Y.

[21] Appl. No.: 09/195,296

[22] Filed: Nov. 18, 1998

[30] Foreign Application Priority Data

Nov. 21, 1997 [FR] France ................................. 97 14668

[51] Int. Cl.$^7$ .................................................. H03M 1/16
[52] U.S. Cl. ............................................................ 341/156
[58] Field of Search .................................... 341/156, 155, 341/159

[56] References Cited

U.S. PATENT DOCUMENTS

| | | | |
|---|---|---|---|
| 4,939,517 | 7/1990 | Baltus et al. | 341/156 |
| 5,745,067 | 4/1998 | Chou et al. | 341/156 |
| 5,874,911 | 2/1999 | Kodama | 341/156 |

OTHER PUBLICATIONS

"An 8–bit Video ADC Incorporating Folding and Interpolation Technique" by Rob E. van de Grift, Ivo W.J.M. Rutten and Martien van der Veen, published in the IEEE Journal of Solid–State Circuits, vol. SC–22, No. 6, Dec. 1987.

*Primary Examiner*—Brian Young
*Attorney, Agent, or Firm*—Steven R. Biren

[57] ABSTRACT

An A/D conversion device, for converting an analog input voltage Vin into a digital output signal encoded in N bits OUT(0:N–1), includes a first decoder (FNE) for generating the least significant bits OUT(0:K) of the output signal, and a second decoder (CRS) for generating signals which are representative of transitions to which the most significant bits OUT(i+1) of the output signal are to be submitted, for i=k to N–2. Each transition of the bit OUT(i+1) is signaled by signals referred to as antecedent signals A(i+1) and subsequent signals P(i+1), while an encoder (ENC) is provided for synchronizing each transition with a transition of the bit OUT(i) of the next lower weight.

5 Claims, 5 Drawing Sheets

| Vin | OUT(3) | OUT(2) | OUT(1) | OUT(0) |
|---|---|---|---|---|
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1 | 1 | 1 | 1 |

FIG. 1

A/D CONVERSION DEVICE HAVING SYNCHRONOUS OUTPUT SIGNALS

BACKGROUND OF THE INVENTION

Dwscription of the Related Art

The invention relates to an A/D conversion device intended, to convert an analog input voltage into a digital output signal encoded in N bits OUT(0:N−1), in which each bit OUT(i), for i=0 to N−1, must successively assume active and inactive states when the value of the input voltage exceeds (2m+1) and (2m+2) times, respectively, a predetermined value Vi which is associated with said bit OUT(i) wherein m may vary between 0 and $2^{(N-1-i)}-1$, said device comprising:

a resistance ladder arranged in series between two power supply terminals and intended to generate a series of reference voltages, a series of comparators, each of which having intended to effect a comparison between the input voltage and a reference voltage, a first decoder intended to generate, on the basis of the results of said comparisons, the K+1 least significant bits OUT(0:K) of the output signal, a second decoder intended to generate, on the basis of the results of said comparisons, signals which are representative of the transitions to which the N−K−1 most significant bits OUT(i+1) of the output signal are to be submitted, for i=K to N−2, and an encoder intended to produce each of said most significant bits OUT(i+1) of the output signal, notably on the basis of the signals generated by the first and second decoders.

Such an A/D conversion device is known from U.S. Pat. No. 4,939,517. In this device, the first decoder generates the least significant bits of the digital output signal in a precise manner, while the second decoder generates signals which constitute approximations of the most significant bits of the digital output signal. The encoder receives these signals, as well as the least significant bits delivered by the first decoder. It also receives, from a synchronizing control circuit, signals intended to signal the input voltage variation ranges in which the most significant bits are to be submitted to transitions. To ensure a synchronization of said transitions with the transitions of the least significant bits, the encoder substitutes a logic combination between said signal and at least one of the least significant bits for each output signal of the second decoder, the resultant signal of this logic combination then constituting one of the most significant bits of the digital output signal.

The conversion technique described above is only efficient if the number of most significant bits is reduced, and is limited in frequency. Indeed, the width of the input voltage variation range during which the bit OUT(K) having the highest weight among the least significant bits has a stable state is $2^i$ smaller than that during which a bit OUT(K+i) of having the weight K+i has a stable state. The larger i is, the more difficult it is for the encoder to synchronize the transitions of the most significant bits with the correct transition of the least significant bits, because this transition becomes more difficult to identify. This leads to a limitation in the dynamic performance of the converter because the, difficulties of synchronization described above become greater as the frequency by which the input voltage varies increases. Delays in the propagation of signals within the device may lead to, for example, a situation where transitions of the least significant bits, which are to serve as references for synchronization, occur outside intervals where the necessary transitions of a most significant bit are signaled by the synchronizing control circuit. Thus appears a critical frequency intrinsic within the circuit: when the frequency of the input voltage exceeds this critical frequency, the precision of the A/D conversion brutally declines.

SUMMARY OF THE INVENTION

The invention enables to overcome to a large extent this frequency limitation by proposing a conversion device in which the transitions of each most significant bit are synchronized with those of its bit of the next lower weight.

According to the invention, a conversion device as described in the opening paragraph is therefore characterized in that the second decoder is provided with signaling means for generating, for each most significant bit OUT(i+1), two signals A(i+1) and P(i+1) referred to as antecedent and subsequent signals, respectively, which have transitions framing each transition of the bit OUT(i+1), and in that the encoder is provided with means for synchronizing each transition of the bit OUT(i+1), signaled by the antecedent and subsequent signals A(i+1) and P(i+1), with a transition of the bit OUT(i) of the next lower weight.

In this conversion device, the bit OUT(i), whose transitions are to serve as references for synchronizing the transitions of the bit OUT(i), has stable states all along ranges of variation of the input voltage which are systematically only twice shorter than those corresponding to the stable states of the bit OUT(i+1). In principle, this enables to prevent the transitions of the bit OUT(i) from occurring outside the input voltage variation ranges identified by the transitions of the antecedent and subsequent signals A(i+1) and P(i+1) as being those where the transitions of the bit OUT(i+1) must happen.

An embodiment of the invention is characterized in that the encoder is arranged in such a way that a logic equation, describing the development of each most significant bit OUT(i+1), for i=K to N−2, is written as OUT(i+1)=A(i+1).OUTn(i)+P(i+1).OUT(i), wherein OUTn(i) is a signal which is complementary to OUT(i), the signaling means of the second decoder being arranged in such a way that of the antecedent and subsequent signals A(i+1) and P(i+1) assume an active state when the value of the input voltage exceeds a first and a second voltage threshold, respectively, which thresholds recur as a function of the development of the value of the input voltage, and an inactive state when the value of the input voltage exceeds a third and a fourth voltage threshold, respectively, which thresholds recur as a function of the development of the value of the input voltage.

In this embodiment, the active states of the antecedent and subsequent signals are logic levels "1" which allow synchronization of the transitions of a bit OUT(i+1) with falling edges of the bit OUT(i).

A particular embodiment of the invention is characterized in that the $j^{th}$ recurrent voltage threshold ranges between (4.p+j).Vi and (4.p+j+1).Vi, in which j varies between 1 and 4 and p may vary between 0 and $2^{(N-2-i)}-1$.

In accordance with this embodiment, the antecedent and subsequent signals A(i+1) and P(i+1) have stable states all along the input voltage variation ranges which are twice longer than those corresponding to the stable states of the bit OUT(i). This allows minimization of the risks that the transitions of the bit OUT(i) serving as references for synchronizing a transition of the bit OUT(i+1) occur outside the input voltage variation ranges identified by the transitions of the antecedent and subsequent signals A(i+1) and P(i+1) as being those where said transitions must happen.

In a variant of this embodiment, the $j^{th}$ recurrent voltage threshold is chosen to be equal to ((4.p+j).Vi)+(Vi/2), in which j varies between 1 and 4 and p may vary between 0 and $2^{(N-2-i)}-1$.

This choice provides a symmetry of the transitions of the antecedent and subsequent signals A(i+1) and P(i+1) with respect to the transitions of the bit OUT(i) serving as reference for synchronizing the transitions of the bit OUT (i+1). This symmetry gives the encoder the maximal insensitivity to phase noise which could affect the antecedent and subsequent signals A(i+1) and P(i+1), or the bit OUT(i).

In a particularly advantageous embodiment of the invention, a conversion device as described above is characterized in that it comprises a module for compiling the results of the comparisons between the input voltage and the reference voltages, intended to supply a series of output signals S(q.V0), in which q varies between 1 and $2^N-1$, V0 being the predetermined value associated with the bit OUT (0), and each signal S(q.V0) being intended to assume an active state when the value of the input voltage exceeds q.V0, and in that the signaling means of the second decoder are arranged in such a way that logic equations describing the developments of the antecedent and subsequent signals A(i+1) and P(i+1), for i=K to N−2, are written as:

$$A(i+1) = \sum_{P=0}^{2^{(n-2-i)}-1} S((4 \cdot p + 3/2) \cdot 2^i \cdot V0) - S((4 \cdot p + 7/2) + 2^i \cdot V0)$$

and $$P(i+1) = \sum_{P=0}^{2^{(N-2-i)}-1} S((4 \cdot p + 5/2) \cdot 2^i \cdot V0) - S((4 \cdot p + 9/2) + 2^i \cdot V0).$$

It will hereinafter be shown that such a choice of recurrent thresholds allows the antecedent and subsequent signals to be processed from signals already existing within the conversion device, which precludes the use of supplementary circuitry and thus leads to an economy of production costs of the device.

These and other aspects of the invention are apparent from and will be elucidated with reference to the embodiments described hereinafter.

BRIEF DESCRIPTION OF THE DRAWINGS

In the drawings:

FIG. 1 shows a truth table describing, in a simple example, the development of the bits of the digital output signal as a function of the analog input voltage;

DESCRIPTION OF THE PREFERRED EMBODIMENTS

Figure 2:
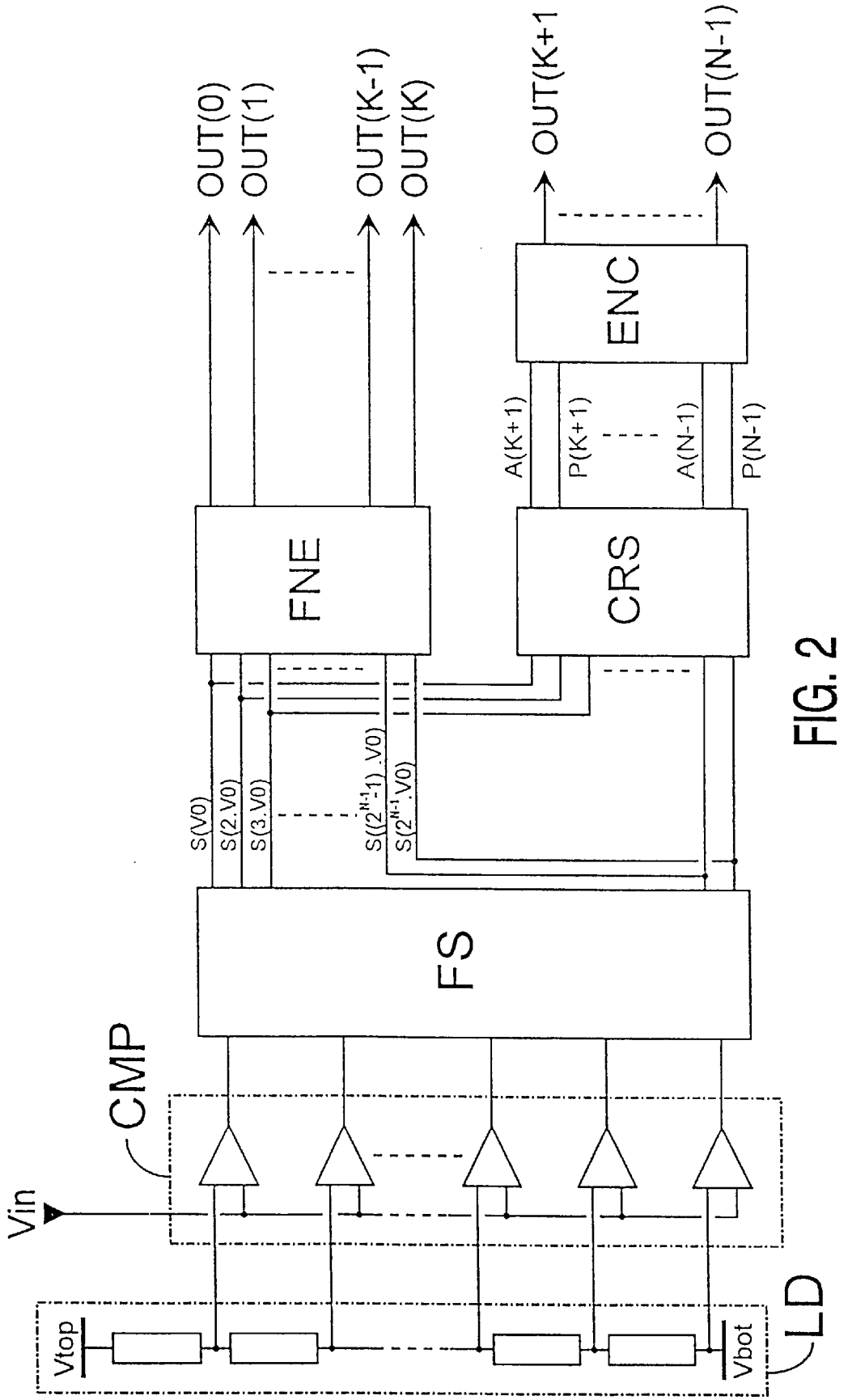
FIG. 2 is a functional diagram showing an A/D conversion device according to the invention.

FIG. 1 is a truth table describing, in a simple example where N=4, the development of the bits OUT(i) of a digital output signal, for i=0 to N−1, resulting from the A/D conversion of an analog input voltage Vin. It can be seen that OUT(0) becomes active, i.e., assumes a logic state "1" in this example, when Vin exceeds the value 1, and subsequently becomes inactive, i.e., assumes a logic state "0" in this example, when Vin exceeds the value 2, then becomes active when Vin exceeds the value 3, and so forth until Vin exceeds the value 15. OUT(1) becomes active when Vin exceeds the value 2, subsequently inactive when Vin exceeds the value 4, then active when Vin exceeds the value 6, and so forth until Vin exceeds the value 14. OUT(2) becomes active when Vin exceeds the value 4, subsequently inactive when Vin exceeds the value 8, then active when Vin exceeds the value 12. Finally, OUT(3) becomes active when Vin exceeds the value 8. Thus, a predetermined value Vi can be associated to each of the bits OUT(i): the predetermined value V0=1 is associated with the bit OUT(0), the predetermined value V1=2 is associated with the bit OUT(1), the predetermined value V2=4 is associated with the bit OUT (2), and the predetermined value V3=8 is associated with the bit OUT(3). In accordance with these notations, a recurrence-based reasoning shows that each bit OUT(i) for i=0 to N−1 must successively assume active and inactive states when the value of the input voltage exceeds (2m+1) and (2m+2) times the predetermined value Vi associated with the bit OUT(i), wherein m may vary between 0 and $2^{(N-1-i)}-1$. It will also be noted that the predetermined value Vi associated with the bit OUT(i) is equal to $2^i$ times the predetermined value V0 associated with the bit OUT(O): Vi=$2^i$.V0.

FIG. 2 shows diagrammatically, an A/D conversion device in accordance with an embodiment of the invention. This device, which is intended to convert an analog input voltage Vin into a digital output signal encoded in N bits OUT(0:N−1), comprises:

- a resistance ladder LD arranged in series between two power supply terminals Vtop and Vbot, intended to generate a series of reference voltages,
- a series of comparators CMP, each of which being intended to effect a comparison between the input voltage Vin and a reference voltage,
- a first decoder FNE intended to generate, on the basis of the results of said comparisons, the K+1 least significant bits OUT(O:K) of the output signal,
- a second decoder CRS intended to generate, on the basis of the results of said comparisons, signals which are representative of the transitions to which the N-K−1 most significant bits OUT(i+1) of the output signal are to be submitted, for i=k to N−2, and
- an encoder ENC intended to produce each of these most significant bits OUT(i+1) of the output signal, notably on the basis of the signals generated by the first and second decoders FNE and CRS.

In this particular embodiment, the conversion device comprises a module FS for compiling the results of the comparisons between the input voltage Vin and the reference voltages. This compilation module FS is intended to supply a series of output signals S(q.V0), in which q varies between 1 and $2^N-1$, V0 being the predetermined value associated with the bit OUT(0). This value V0 represents the minimal variation of the analog input voltage Vin having influence on the digital output signal. It thus determines the resolution, i.e., the maximal precision, of the A/D conversion which can be achieved with the device. Each signal S(q.V0) is intended to assume an active state when the value of the input voltage exceeds q.V0. These signals can be indifferently generated by using a "full-parallel" structure or a "folding" structure, followed or not followed by an interpolation. These structures, which are well known to those skilled in the art, are described in the article "An 8-bit Video ADC Incorporating Folding and Interpolation technique" by Rob E. van de Grift, Ivo W. J. M. Rutten and Martien van der Veen, published in the IEEE Journal of Solid-State Circuits, vol. SC-22, No.6, December 1987.

The second decoder CRS is provided with signaling means for generating, for each most significant bit OUT(i+1), for i=k to N−2, two signals A(i+1) and P(i+1) referred to as antecedent and subsequent signals, respectively, which have transitions framing each transition of the bit OUT(i+1). The encoder is provided with means for synchronizing each transition of the bit OUT(i+1), signaled by the antecedent and subsequent signals A(i+1) and P(i+1), with a transition of the bit OUT(i) of the next lower weight.

Figure 3:
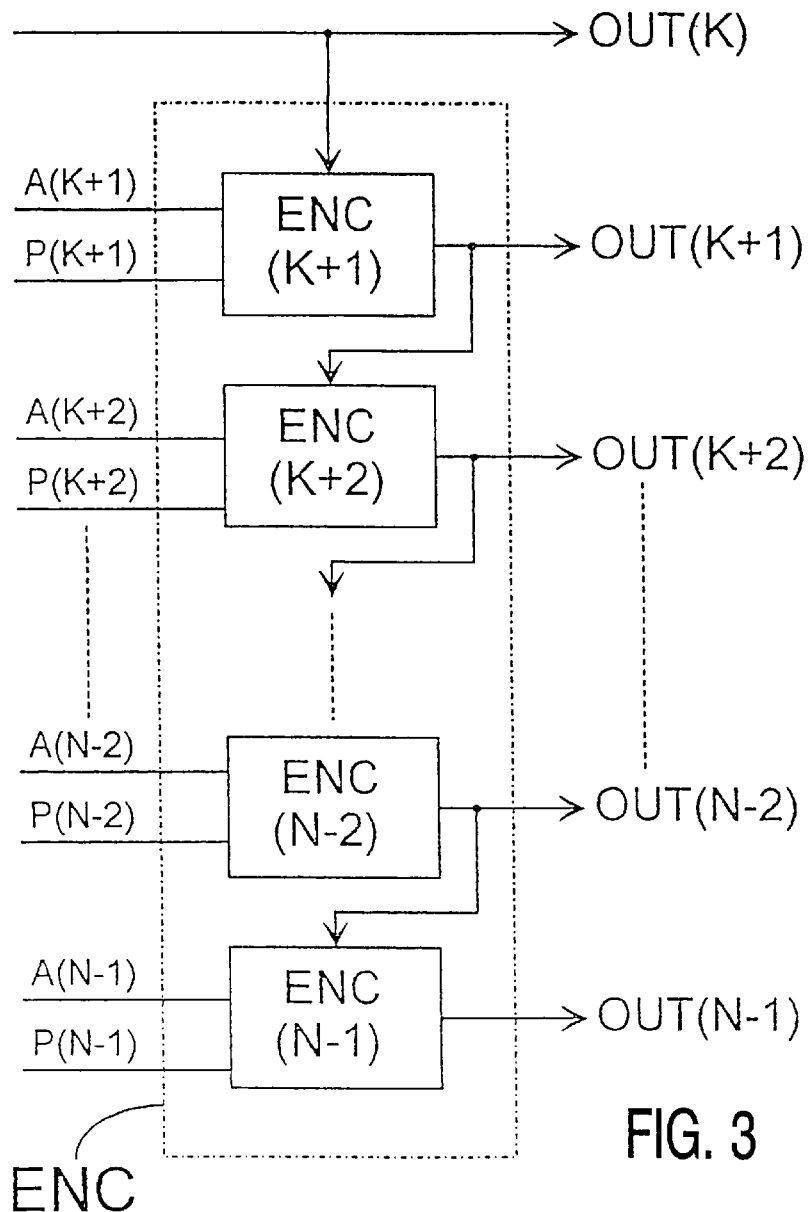
FIG. 3 is a functional diagram showing an encoder incorporated in such a conversion device.

FIG. 3 shows diagrammatically, the structure of the encoder ENC. This encoder is constituted by N−K−1 identical elementary cells DEC(i+1), for i=K to N−2, each intended for generating a most significant bit OUT(i+1) on the basis of the antecedent and subsequent signals A(i+1) and P(i+1) supplied by the second decoder CRS, and the bit of the next lower weight OUT(i).

Figure 4:
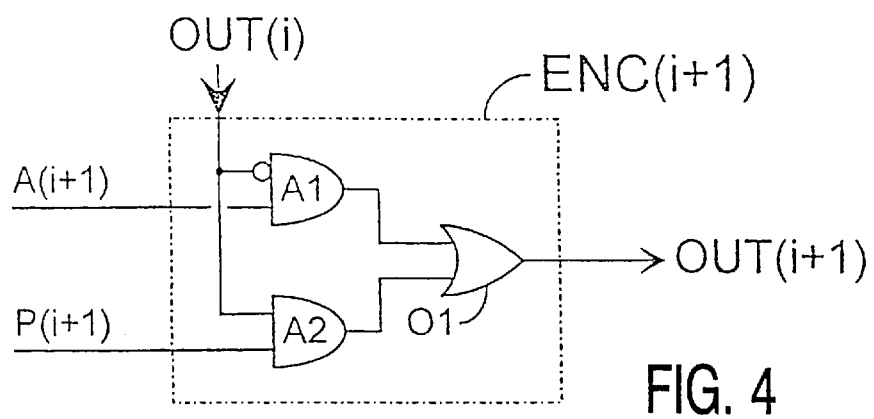
FIG. 4 is an electric circuit diagram showing a portion of such an encoder.

FIG. 4 is an electric circuit diagram showing an embodiment of an elementary cell ENC(i+1) incorporated in the encoder ENC. This cell is intended to receive the antecedent and subsequent signals A(i+1) and P(i+1) at the input, as well as the bit OUT(i), and to supply at the output the bit OUT(i+1) of the conversion device's digital output signal. A logic AND gate A1 having two inputs receives the bit OUT(i) at an inverting input and the antecedent signal A(i+1) at its other input. A logic AND gate A2 having two inputs receives the bit OUT(i) at one input and the subsequent signal P(i+1) at the other input. The outputs of the logic AND gates A1 and A2 are connected to two inputs of a logic OR gate O1 whose output supplies the bit OUT(i+1) defined by the equation OUT(i+1)=A(i+1).OUTn(i)+P(i+1).OUT(i), where OUTn(i) is a signal which is complementary to OUT(i). In this embodiment, the choice of logic levels "1" for the active states of the antecedent and subsequent signals allows synchronization of the transitions of a bit OUT(i+1) with the falling edges of the bit OUT(i), in conformity with the development illustrated by the truth table in FIG. 1.

Figure 5:
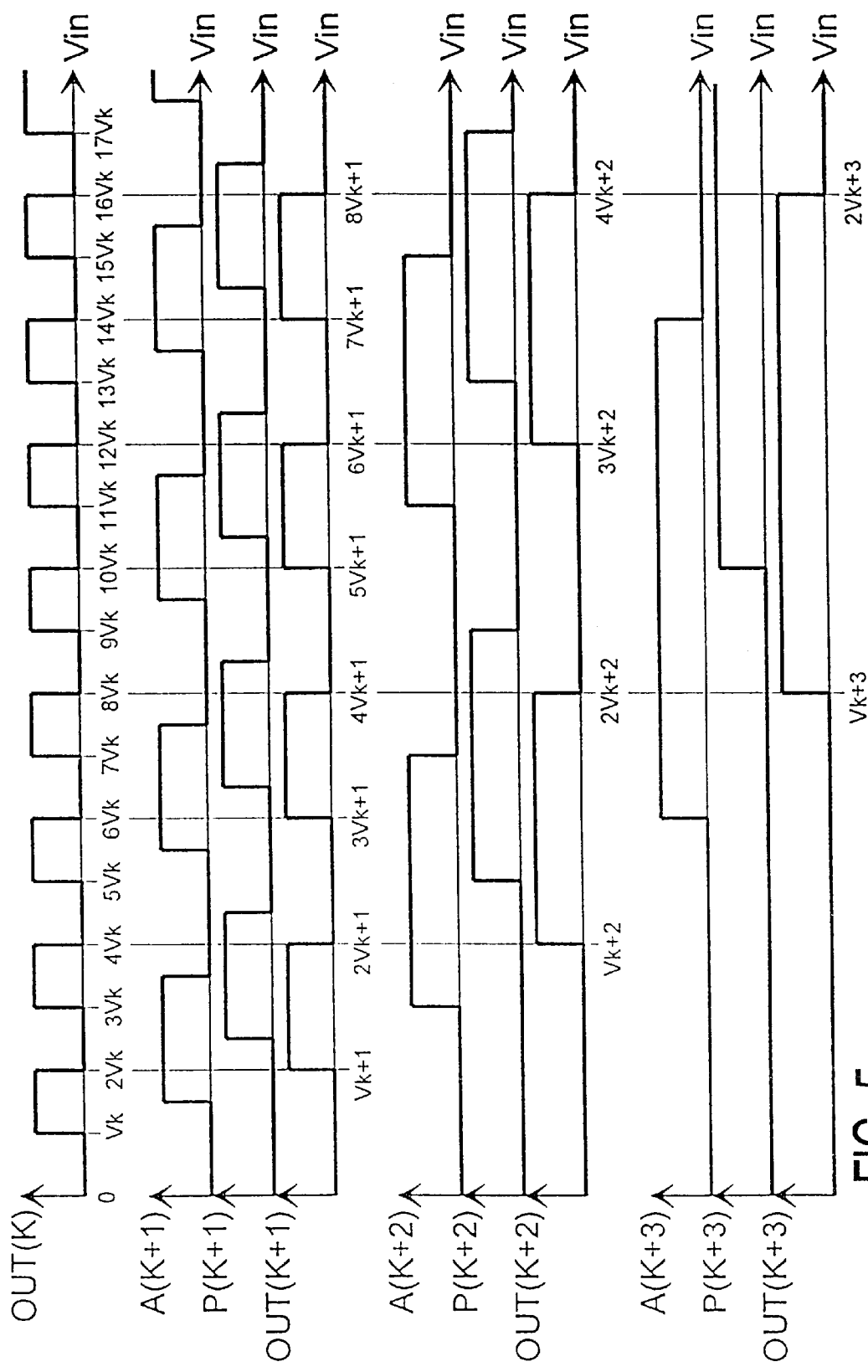
FIG. 5 is a set of chronograms notably describing the development of the antecedent and subsequent signals as a function of the input voltage.

FIG. 5 shows a set of chronograms enabling to visualize the functioning of the conversion device. The signaling means of the second decoder CRS are arranged in such a way that the antecedent and subsequent signals A(i+1) and P(i+1) assume an active state when the value of the input voltage Vin exceeds a first and a second voltage threshold, respectively, which thresholds recur as a function of the development of the value of the input voltage, and an inactive state when the value of the input voltage exceeds a third and a fourth voltage threshold, respectively, which thresholds recur as a function of the development of the value of the input voltage. Each most significant bit OUT(i+1) being defined by the equation OUT(i+1)=A(i+1).OUTn(i)+P(i+1).OUT(i), where OUTn(i) is a signal which is complementary to OUT(i), as described above, the bit OUT(K+1) assumes an active state when the antecedent signal A(K+1) is in the active state and when OUT(i) has a falling edge. OUT(K+1) keeps this active state when OUT (K) becomes active again, because the subsequent signal P(K+1) is then in the active state. OUT(K+1) only becomes inactive at the next falling edge to of OUT(K). The transitions of the bit O(UT(K+1), framed by those of the antecedent and subsequent signals A(K+1) and P(K+1), are thus synchronized with the falling edges of the bits OUT(K) having the next lower weight. The description of this functioning may be transposed to the processing of the bits OUT(K+2) and OUT(K+3), also shown in FIG. 5. Thus, for every i=k to K−N−2, the bit OUT(i), whose transitions are to serve as references for synchronizing the transitions of the bit OUT(i+1), has stable states all along ranges of variation of the input voltage Vin which are systematically only twice shorter than those corresponding to the stable states of the bit OUT(i+1). In principle, this enables to prevent the transitions of the bit OUT(i) from occurring outside the input voltage variation ranges identified by the transitions of the antecedent and subsequent signals A(i+1) and P(i+1) as being those where the transitions of the bit OUT(i+1) must happen.

In the particular case described here, the $j^{th}$ recurrent voltage threshold is equal to $((4.p+j).Vi)+(Vi/2)$, in which j varies between 1 and 4 and p may vary between 0 and $2^{(N-2-i)}-1$. Thus, the antecedent signal A(k+1) has rising edges when the input voltage Vin exceeds 3/2.Vk, 11/2.Vk, 19/2.Vk, 27/2.Vk, 35/2.Vk, . . . , and falling edges when the input voltage Vin exceeds 7/2.Vk, 15/2.Vk, 23/2.Vk, 31/2.Vk, . . . The subsequent signal P(k+1) has rising edges when the input voltage Vin exceeds 5/2.Vk, 13/2.Vk, 21/2.Vk, 29/2.Vk, . . . , and falling edges when the input voltage Vin exceeds 9/2.Vk, 17/2.Vk, 25/2.Vk, 33/2.Vk, . . . . Such a choice of the recurrent voltage thresholds has several advantages: first, the antecedent and subsequent signals A(i+1) and P(i+1) have stable states all along the input voltage variation ranges which are twice longer than those corresponding to the stable states of the bit OUT(i). This allows after the more minimization of the risks that the transitions of the bit OUT(i) serving as references for synchronizing a transition of the bit OUT(i+1) occur outside the input voltage variation ranges identified by the transitions of the antecedent and subsequent signals A(i+1) and P(i+1) as being those where said transitions must happen. Moreover, this choice provides a symmetry of the transitions of the antecedent and subsequent signals A(i+1) and P(i+1) with respect to the transitions of the bit OUT(i) serving as references for synchronizing the transitions of the bit OUT (i+1). This symmetry gives the encoder the maximal insensitivity to phase noise which could affect the antecedent and subsequent signals A(i+1) and P(i+1), or the bit OUT(i). Indeed, it allows as large a shift of the falling edges of the bit OUT(i) towards the transitions of the antecedent signal A(i+1) as towards the transitions of the subsequent signal P(i+1). An asymmetry of the transitions of the antecedent and subsequent signals A(i+1) and P(i+1) with respect to the transitions of the bit OUT(i) would imply a larger tolerance to phase noise in one direction, but a smaller tolerance in the other direction. The symmetry of the transitions of the antecedent and subsequent signals A(i+1) and P(i+1) with respect to the transitions of the bit OUT(i) allows implementation of a particularly advantageous realization of the antecedent and subsequent signals, which will be elucidated with reference to the following Figure.

Figure 6:
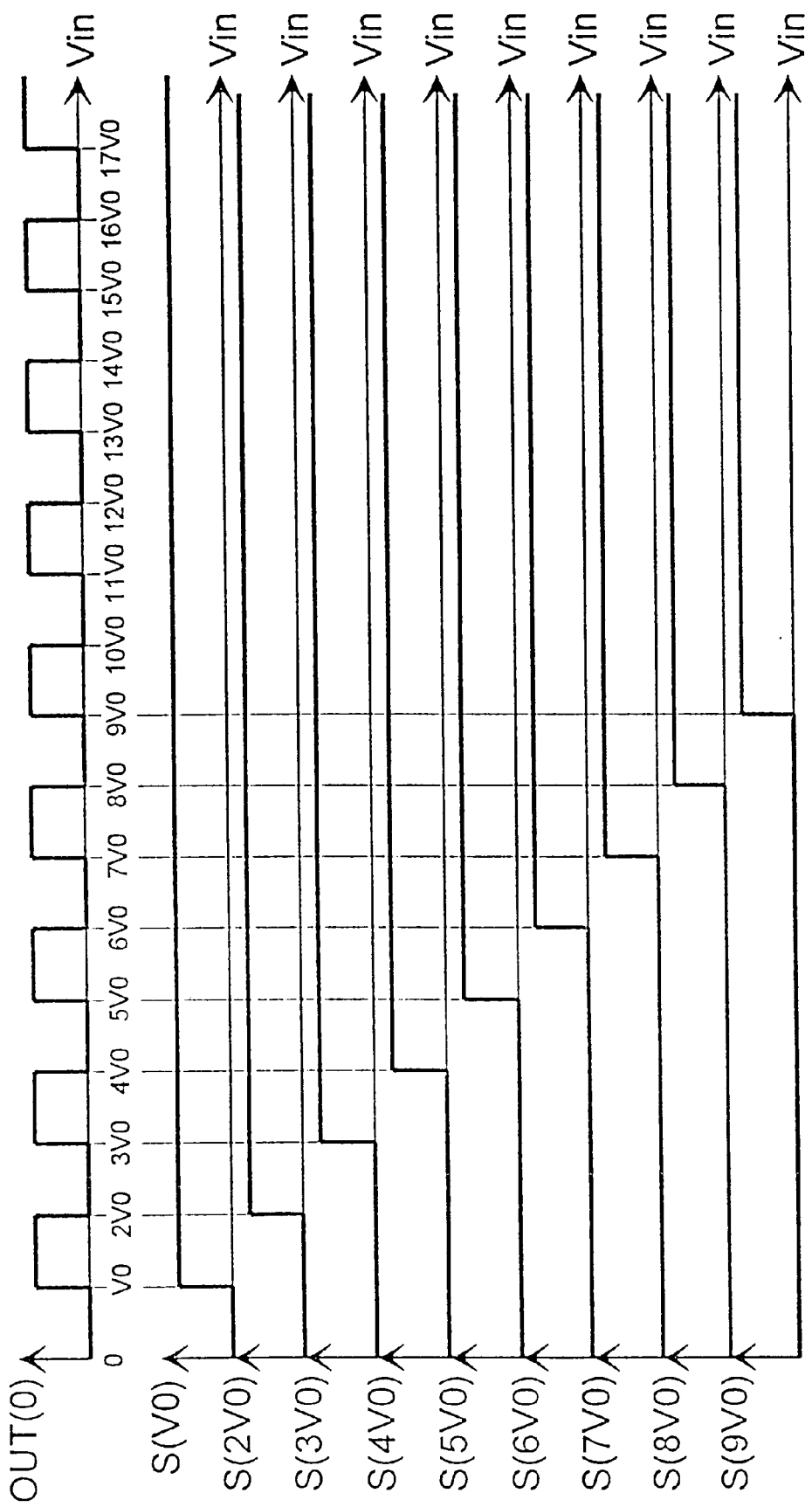
FIG. 6 is a set of chronograms describing the development of the signals supplied by a compilation module incorporated in a conversion device in accordance with a particular embodiment of the invention.

FIG. 6 is a set of chronograms describing the development of the output signals S(q.V0) of the compilation module FS for q=1 to 9. Each of these signals has a rising edge when the input voltage Vin reaches the value p.V0 and remains in the active state when Vin exceeds this threshold. The symmetry of the transitions of the antecedent and subsequent signals A(i+1) and P(i+1) with respect to the transitions of the bit OUT(i) serving as references for synchronizing the transitions of the bit OUT(i−1), symmetry which is obtained by choosing the recurrent voltage thresholds halfway between two successive multiples of the predetermined value Vi associated with the bit OUT(i) authorizes the use of the signals S(q.V0) for processing the antecedent and subsequent signals. It has already been noted that each predetermined value Vi associated with a bit OUT(i) of the digital output signal of the device is equal to $2^i.V0$. Each recurrent voltage threshold thus corresponds to one of the thresholds q.V0. This property can be visualized by means of a simple example: if, in the chronograms of FIG. 5, it is assumed that K=1, the first, second, third and fourth recurrent voltage thresholds of the antecedent and subsequent signals A(2) and P(2) are 3/2.V1, 5/2.V1, 7/2.V1, 9/2.V1, . . . or 3.V0, 5.V0, 7.V0, 9.V0 . . . The first, second, third and fourth recurrent voltage thresholds of the antecedent and subsequent signals A(3) and P(3) are 3/2.V2, 5/2.V2, 7/2.V2, 9/2.V2, ..., or 6.V0, 10.V0, 14.V0, 18.V0 ... The equations of the antecedent and subsequent signals A(i+1) and P(i+1) resulting from the symmetrical arrangement of the recurrent voltage thresholds with respect to two successive multiples of Vi, for i=K to N−2, can be written as:

$$A(i+1) = \sum_{P=0}^{2^{(n-2-i)}-1} S((4 \cdot p + 3/2) \cdot Vi) - S((4 \cdot p + 7/2) \cdot Vi)$$

and $$P(i+1) = \sum_{P=0}^{2^{(N-2-i)}-1} S((4 \cdot p + 5/2) \cdot Vi) - S((4 \cdot p + 9/2) \cdot Vi)$$

In the particular embodiment described in this example, the antecedent and subsequent signals A(i+1) and P(i+1) are generated on the basis of the output signals of the compilation module FS in accordance with the equations $$A(i+1) = \sum_{P=0}^{2^{(n-2-i)}-1} S((4 \cdot p + 3/2) \cdot 2^i \cdot V0) - S((4 \cdot p + 7/2) + 2^i \cdot V0)$$

and $$P(i+1) = \sum_{P=0}^{2^{(N-2-i)}-1} S((4 \cdot p + 5/2) \cdot 2^i \cdot V0) - S((4 \cdot p + 9/2) + 2^i \cdot V0).$$

Other structures within the scope of the invention and known to those skilled in the art may be implemented for generating the antecedent and subsequent signals. Nevertheless, the structure described above has the advantage that signals already existing within the conversion device can be utilized, which precludes the use of supplementary circuitry and thus leads to an economy of production costs of the device.

What is claimed is:

1. An A/D conversion device for converting an analog input voltage into a digital output signal encoded in N bits OUT(0:N−1), in which each bit OUT(i), for i=0 to N−1, must successively assume active and inactive states when the value of the input voltages exceeds (2m+1) and (2m+2) times, respectively, a predetermined value Vi which is associated with said bit OUT(i), wherein m may vary between 0 and $2^{(N-1-i)}-1$, said device comprising:

a resistance ladder arranged, in series, between two power supply terminals for generating a series of reference voltages;

a series of comparators, each effecting a comparison between the input voltage and a reference voltage;

a first decoder for generating, on the basis of the results of said comparisons, the K+1 least significant bits OUT(0:K) of the output signal;

a second decoder for generating, on the basis of the results of said comparisons, signals which are representative of the transitions to which the N−K−1 most significant bits OUT(i+1) of the output signal are to be submitted, for i=K to N−2; and an encoder for producing each of said most significant bits OUT(i+1) of the output signal on the basis of the signals generated by the first and second decoders, characterized in that the second decoder comprises signaling means for generating, for each most significant bit OUT(i+1), two signals A(i+1) and P(i+1) referred to as antecedent and subsequent signals, respectively, said antecedent and subsequent signals having transitions framing each transition of the bit OUT(i+1), and in that the encoder comprises means for synchronizing each transition of the bit OUT(i+1), signaled by the antecedent and subsequent signals A(i+1) and P(i+1), with a transition of the bit OUT(i) of the next lower weight.

2. An A/D conversion device as claimed in claim 1, characterized in that the encoder is arranged in such a way that a logic equation describing the development of each most significant bit OUT(i+1), for i=K to N−2, is written as OUT(i+1)=A(i+1).OUTn(i)+P(i+1).OUT(i), wherein OUTn(i) is a signal which is complementary to OUT(i), the signaling means of the second decoder being arranged in such a way that the antecedent and subsequent signals A(i+1) and P(i+1) assume an active state when the value of the input voltage exceeds a first and a second voltage threshold, respectively, aid first and second thresholds recurring as a function of the development of the value of the input voltage, and an inactive state when the value of the input voltage exceeds a third and a fourth voltage threshold, respectively, said third and fourth thresholds recurring as a function of the development of the value of the input voltage.

3. An A/D conversion device as claimed in claim 2, characterized in that the $j^{th}$ recurrent voltage threshold ranges between (4.p+j).Vi and (4.p+j+1).Vi, in which j varies between 1 and 4 and p may vary between 0 and $2^{(N-2-i)}-1$.

4. An A/D conversion device as claimed in claim 3, characterized in that the $j^{th}$ recurrent voltage threshold is equal to ((4.p+j).Vi)+(Vi/2), in which j varies between 1 and 4 and p may vary between 0 and $2^{(N-2-i)}-1$.

5. An A/D conversion device as claimed in claim 4, characterized in that said A/D conversion device comprises a module for compiling the results of the comparisons between the input voltage and the reference voltages, and for supplying a series of output signals S(q.V0), in which q varies between 1 and $2^N-1$, V0 being the predetermined value associated with the bit OUT(0), and each signal S(q.V0) assuming an active state when the value of the input voltage exceeds q.V0, and in that the signaling means of the second decoder are arranged in such a way that logic equations, describing the developments of the antecedent and subsequent signals A(i+1) and P(i+1), for i=K to N−2, are written as:

$$A(i+1) = \sum_{P=0}^{2^{(n-2-i)}-1} S((4 \cdot p + 3/2) \cdot 2^i \cdot V0) - S((4 \cdot p + 7/2) + 2^i \cdot V0)$$

and $$P(i+1) = \sum_{P=0}^{2^{(N-2-i)}-1} S((4 \cdot p + 5/2) \cdot 2^i \cdot V0) - S((4 \cdot p + 9/2) + 2^i \cdot V0).$$

* * * * *